United States Patent
Abdulla

(10) Patent No.: US 9,305,606 B2
(45) Date of Patent: Apr. 5, 2016

(54) HIGH-SPEED WIRELESS SERIAL COMMUNICATION LINK FOR A STACKED DEVICE CONFIGURATION USING NEAR FIELD COUPLING

(75) Inventor: Mostafa Naguib Abdulla, Rancho Cordova, CA (US)

(73) Assignee: Micron Technology, Inc., Boise, ID (US)

(*) Notice: Subject to any disclaimer, the term of this patent is extended or adjusted under 35 U.S.C. 154(b) by 600 days.

(21) Appl. No.: 12/542,528

(22) Filed: Aug. 17, 2009

(65) Prior Publication Data

US 2011/0040909 A1 Feb. 17, 2011

(51) Int. Cl.
*G06F 3/06* (2006.01)
*G11C 5/04* (2006.01)
*G11C 5/02* (2006.01)
*G06F 13/38* (2006.01)
*G11C 7/10* (2006.01)

(52) U.S. Cl.
CPC .. *G11C 5/04* (2013.01); *G11C 5/02* (2013.01); *G11C 7/1075* (2013.01); *H01L 2224/48091* (2013.01); *H01L 2224/48227* (2013.01); *H01L 2924/15311* (2013.01)

(58) Field of Classification Search
None
See application file for complete search history.

(56) References Cited

U.S. PATENT DOCUMENTS

| 2005/0082664 | A1* | 4/2005 | Funaba et al. .............. 257/724 |
| 2005/0162770 | A1* | 7/2005 | Yanagita et al. ............ 360/55 |
| 2009/0037688 | A1* | 2/2009 | Kalyanasundharam et al. .............. 711/202 |
| 2009/0267848 | A1* | 10/2009 | Kuroda ...................... 343/720 |

* cited by examiner

*Primary Examiner* — Scott Sun
(74) *Attorney, Agent, or Firm* — Schwegman Lundberg & Woessner, P.A.

(57) ABSTRACT

A memory module houses stacked memory devices and a memory controller each having a near-field interface coupled to loop antennas to communicate over-the-air data. A coil is formed on a memory device substrate or molded into a plastic mold to create near-field magnetic coupling with the stacked memory devices and the memory controller.

21 Claims, 5 Drawing Sheets

HIGH-SPEED WIRELESS SERIAL COMMUNICATION LINK FOR A STACKED DEVICE CONFIGURATION USING NEAR FIELD COUPLING

With current demand for high density memory, the die stacking technology is one solution to achieve a required density. However, die stacking places many devices in parallel which produces a capacitive loading effect that adversely reduces the bus bandwidth and limits the amount of data that can be transferred though a data link. There is a need for a viable solution that provides high density without reducing the maximum allowable data rate on a bus due to loading.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
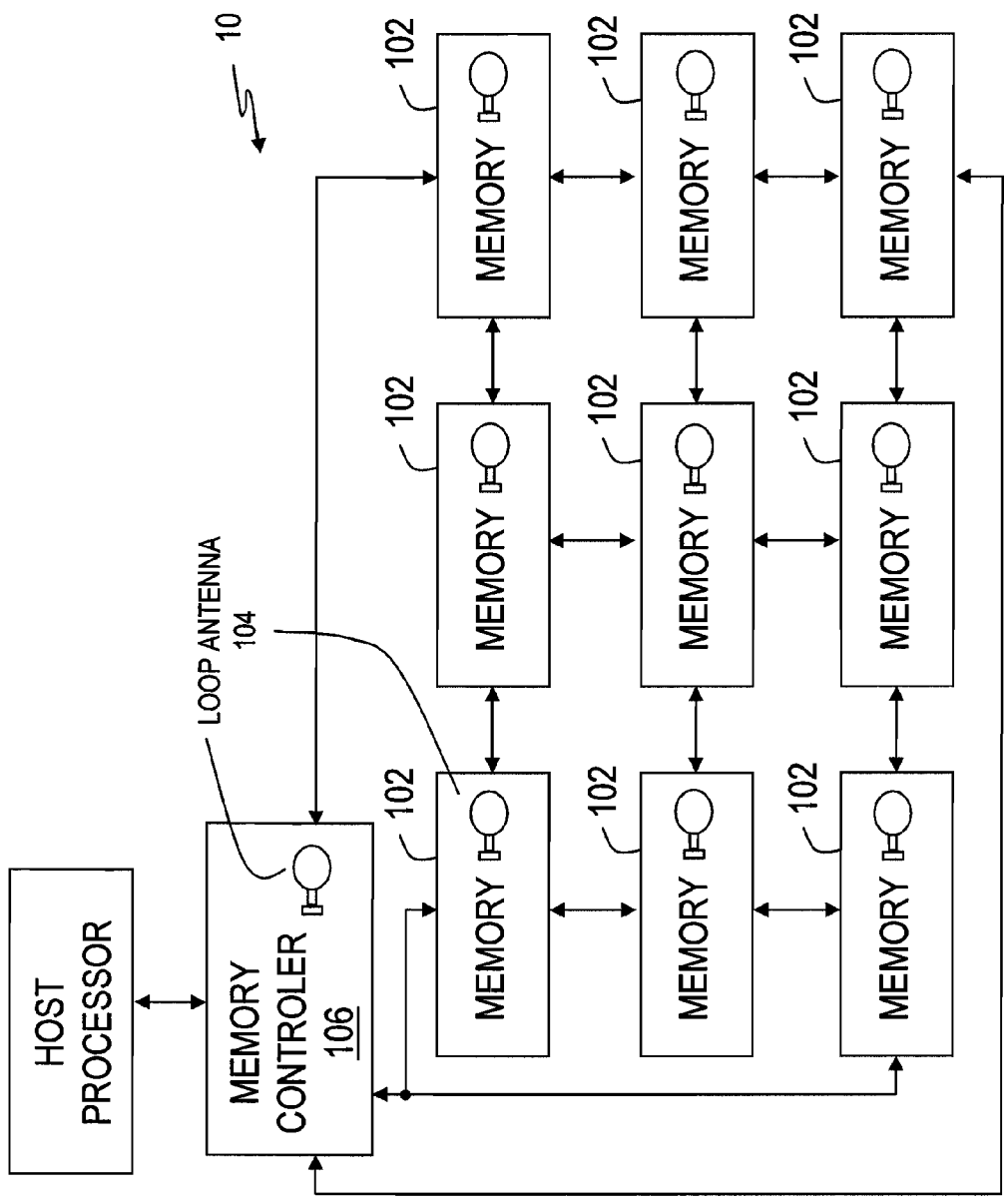
FIG. 1 shows an architecture that enables a memory controller and multiple memory devices to be configured for communicating in a distributed sub-system in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

The embodiment illustrated in FIG. 1 shows an architecture that enables a memory controller and multiple memory devices 102 to be configured for communicating in a distributed sub-system 10. In order to facilitate communication between a large number of devices, each device in distributed sub-system 10 is assigned their own address. This gives each memory device 102 the ability to route messages to other devices in the sub-system. Although the figure illustrates memory devices in a 3×3 array, distributed sub-system 10 may be configured having much larger numbers of devices in the network.

The message passing among distributed memory devices 102 uses a near-field magnetic technology as indicated by loop antenna 104 that eliminates the need for direct electrical contact in providing inter-die communication. In accordance with the present invention, serial data links using the over-the-air transmissions are responsible for delivery and for verifying that the correct data was transmitted from a memory controller 106 to any of the devices in distributed sub-system 10, and from one memory device 102 directly to another memory device. Support to detect errors or lost data triggers retransmission until the data is verified as being correct and completely received.

Figure 2:
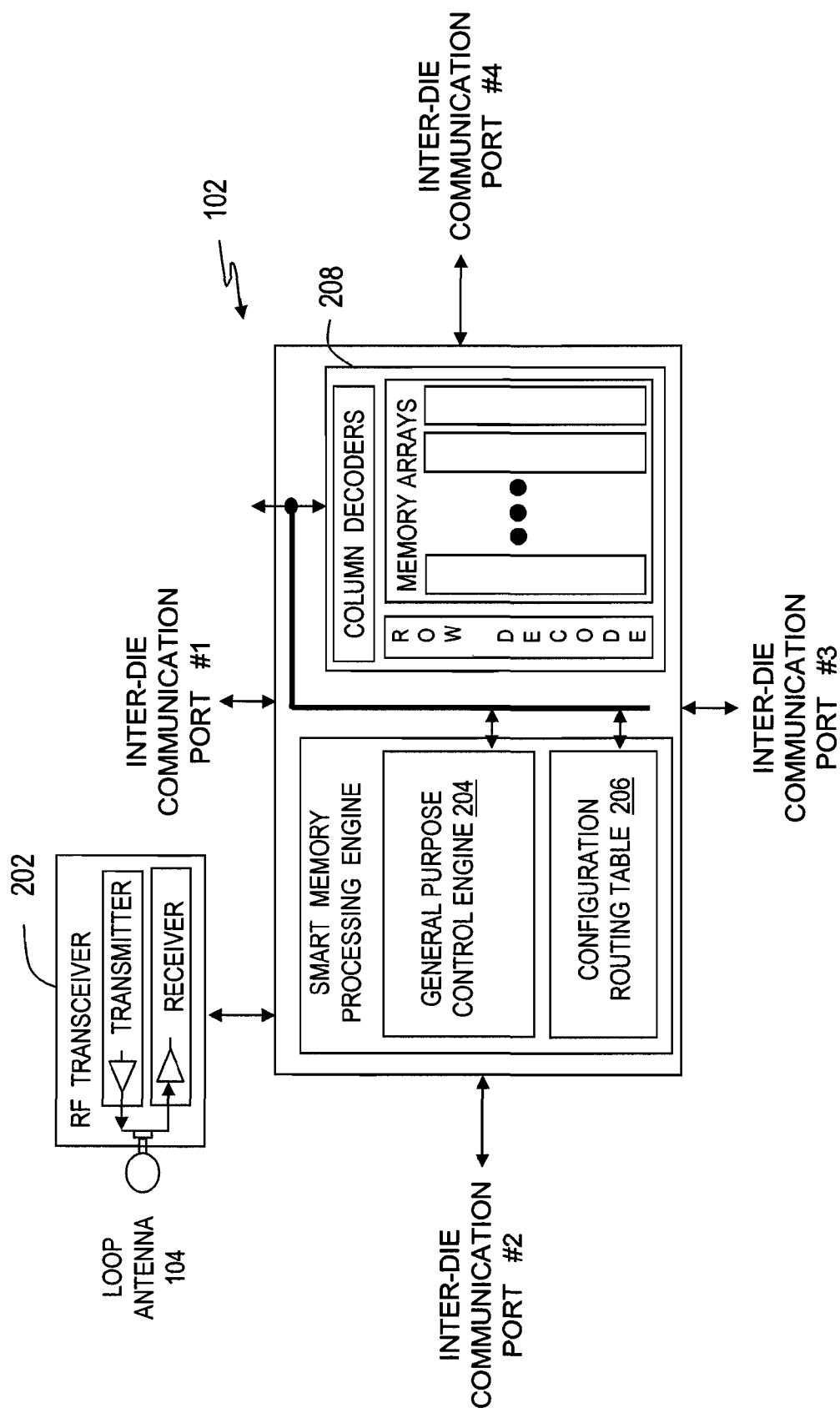
FIG. 2 shows the memory device having a general purpose control engine embedded with a storage array that is coupled to a near-field loop antenna to transfer wireless signals.

The wireless architecture embodiment illustrated in FIG. 2 shows memory device 102 having a general purpose control engine 204 embedded with a storage array 208 that may be either volatile or nonvolatile memory. Memory device 102 is coupled to a near-field loop antenna 104 and receiver 202 to transfer wireless signals. One or more antennas allow the radio to program the memory arrays and download algorithms and databases by communicating using over-the-air communication signals. A configuration routing table 206 keeps track of the other memory devices within distributed sub-system 10. The configuration of distributed sub-system 10 may be dynamically determined and the route table updated while memory devices 102 operate within the system.

Figure 3:
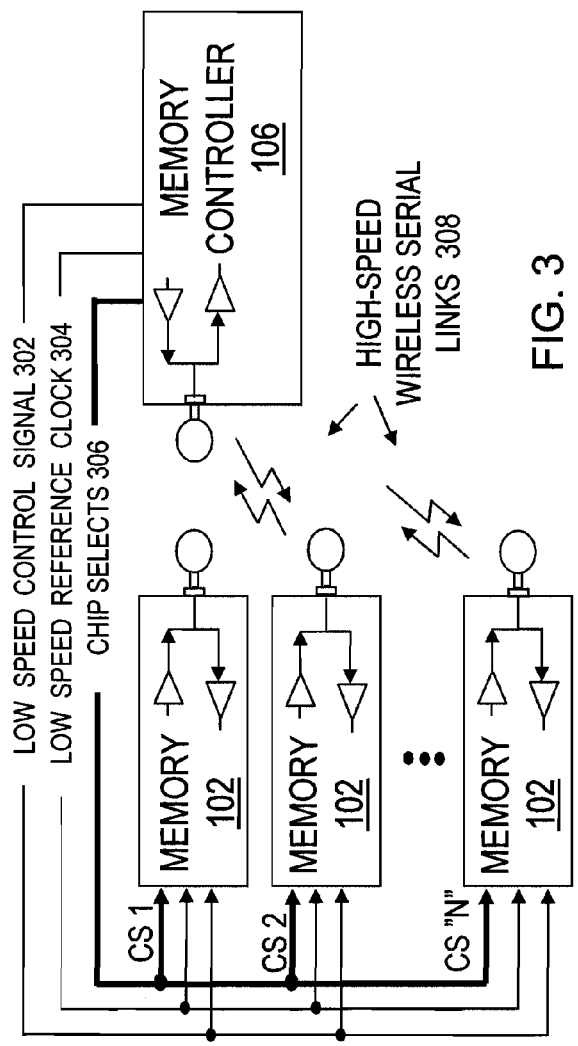
FIG. 3 describes signals that may be hard wired and over-the-air data links that transfer data between devices within the distributed sub-system.

FIG. 3 illustrates signals such as, for example, control signals 302, reference clocks 304, and individual chip select signals 306 that may be hard wired to the devices within distributed subsystem 10. To eliminate the need for direct electrical contacts and reduce bus loading, loop antennas provide near-field magnetic coupling that establishes multiple data links 308 for transferring data between the memory controller 106 and devices located within distributed sub-system 10.

Figure 4:
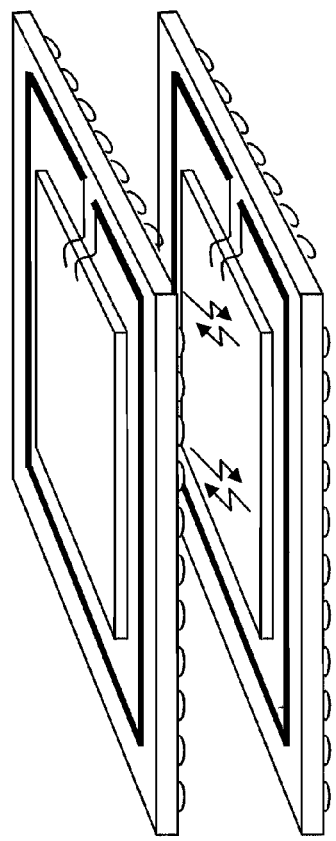
FIG. 4 illustrates a coil built into each memory device that creates near-field magnetic coupling.

FIG. 4 illustrates the use of a coil built into each memory device 102 that creates near-field magnetic coupling. In one embodiment the small coils may be molded into plastic housings or be formed in a substrate to which the memory device is attached. In addition, the loop antenna may be designed within the package substrate design as a trace within the package layers. Various embodiments of the invention pertain to using radio frequency wireless signals in near-field to program memory device 102. The radio subsystems collocated in each of the memory devices 102 of distributed sub-system 10 provide the capability of communicating effectively across a short distance in a location space with other devices in the network. The near-field magnetic technology eliminates the need for direct electrical contact and provides positioning choices of the memory devices.

Figure 5:
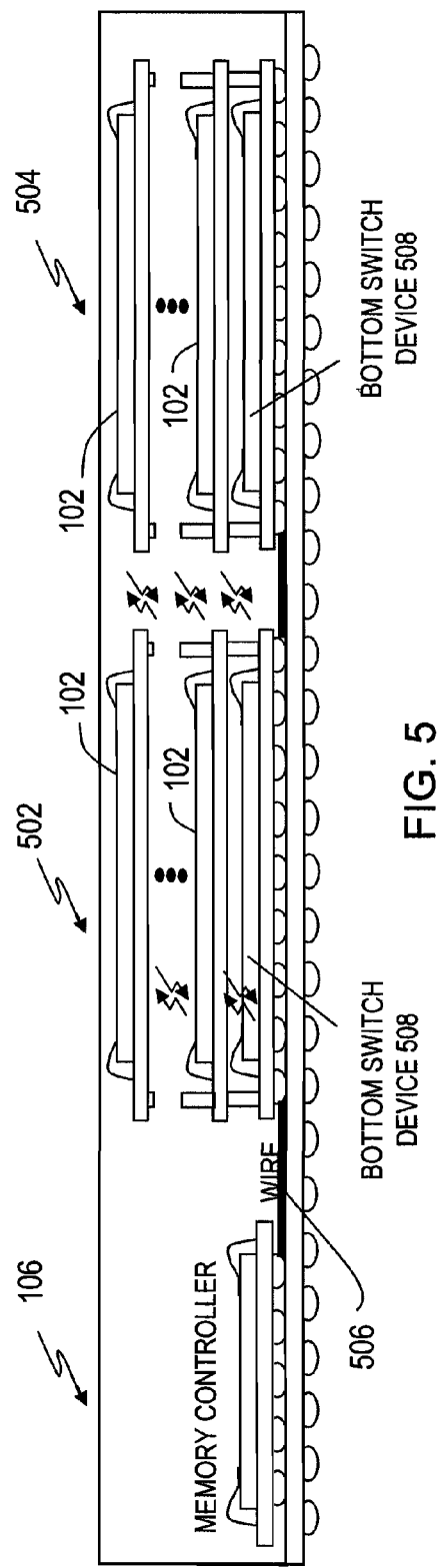
FIG. 5 illustrates multiple memory devices each having a loop antenna stacked on top of one another in the same package.

FIG. 5 illustrates multiple memory devices 102 each with an associated loop antenna 104 with the memory/antenna combination then stacked on top of one another in the same package. These contact-less links use near field coupling among the antennas (loop antenna or any antenna) of each device in the stack. The antenna may be single loop on each device (on each die) or may be on each package or within the package substrate as either single or multiple loops and routed from substrate traces when stacked in PoP configurations.

The dies mounted on a substrate are stacked and bumped to create either a Chip Scale Package (CSP) or a Ball Grid Array (BGA) as the final package. This method of die stacking integrates semiconductor devices vertically in a single package to directly influence the amount of silicon that can be included in a given package footprint. Die stacking simplifies the surface-mount pc-board assembly and conserves pc-board real estate because fewer components are placed on the board.

This packaging technology has evolved to multiple die stacks 502, 504, side-by-side combinations of stacked and unstacked dies such as memory controller 106, and different memory combinations that may place volatile memory with nonvolatile memory. The loop antennas are incorporated into the substrate of each memory device 102 to provide the near-field magnetic coupling that eliminates the need for direct electrical contact and reduces bus loading. To facilitate wire bonding capabilities in stacking multiple devices in a Ball Grid Array (BGA) surface mount module, decisions may be based on the bond pad placements as designed on the memory die to determine any need for separators, the stacking order, the thickness of the memory die substrates, and their stair-stepping and die rotation configurations.

In accordance with the present invention, the combination of loop antennas with the memory device 102 provides inter-die communication while maintaining the maximum allowable data rate. Each memory device 102 uses its own high speed bidirectional serial port and loop antenna to establish a communication link with other memory devices and to also communicate with the bottom switch device 508. Bottom switch device 508 (or link controller) selects the device chip-select pin for each memory device 102 to control the bus arbitration. Bottom switch device 508 communicates with memory controller 106 using wired serial links 506.

Figure 6:
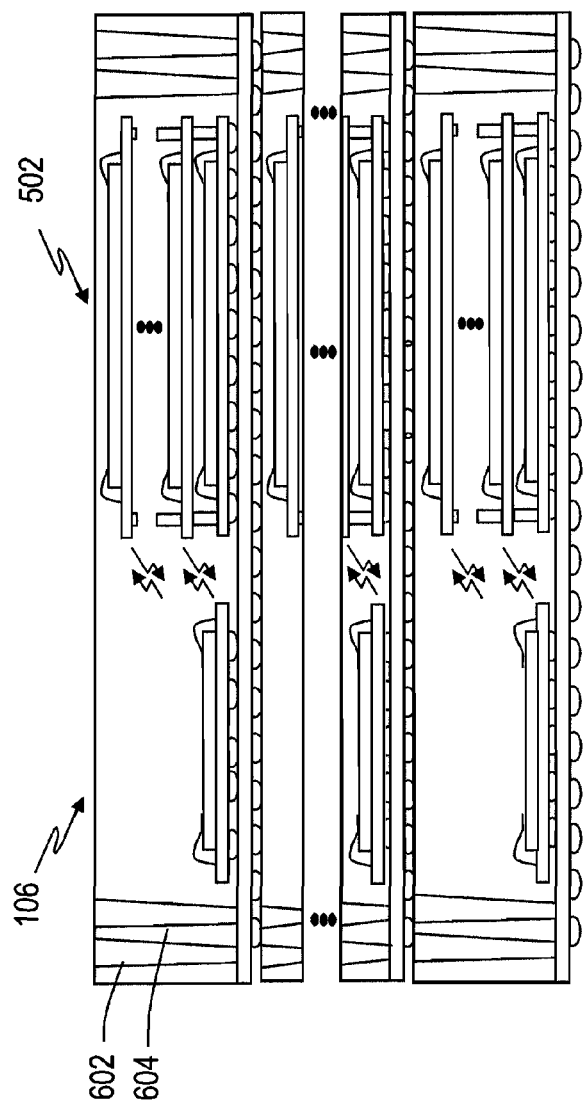
FIG. 6 illustrates a plurality of die-stacking modules that communicate using near-field magnetic coupling that are interconnected to form a Package-On-Package.

FIG. 6 illustrates further increases in the memory density through the use of a plurality of die-stacking modules that are interconnected to form a Package-On-Package. In one embodiment the die-stacking modules are identical and interchangeable, one with another, within the PoP. However, using identical modules within the PoP is not a limitation and other embodiments may incorporate non-identical modules within the same PoP.

By using the near field communication between devices such as memory devices 102, for example, multiple devices may be stacked without degrading the link speed. This wireless architecture can serial link multiple devices housed within the PoP using an enhanced Gigabit Ethernet port such as, for example, PCI Express® and/or Mobile PHYs (MIPI MPHY) to reach the desired high speeds in the range of 3-5 Gb/s.

The figure shows connections 602, 604 that extend vertically through a package mold to electrical pads on the bottom of the die-stacking module. These connections provide electrical paths to route the signals such as control signals, reference clocks, and individual chip select signals. The connections may be completed by drilling vias into the mold and then filling the vias with a solder paste, electrically conductive adhesives, or other suitable electrically conductive materials. Alternatively, solder or metal pillars may be in place prior to the mold process, where a grinding process on the finished mold exposes the metal for the electrical pads.

Figure 7:
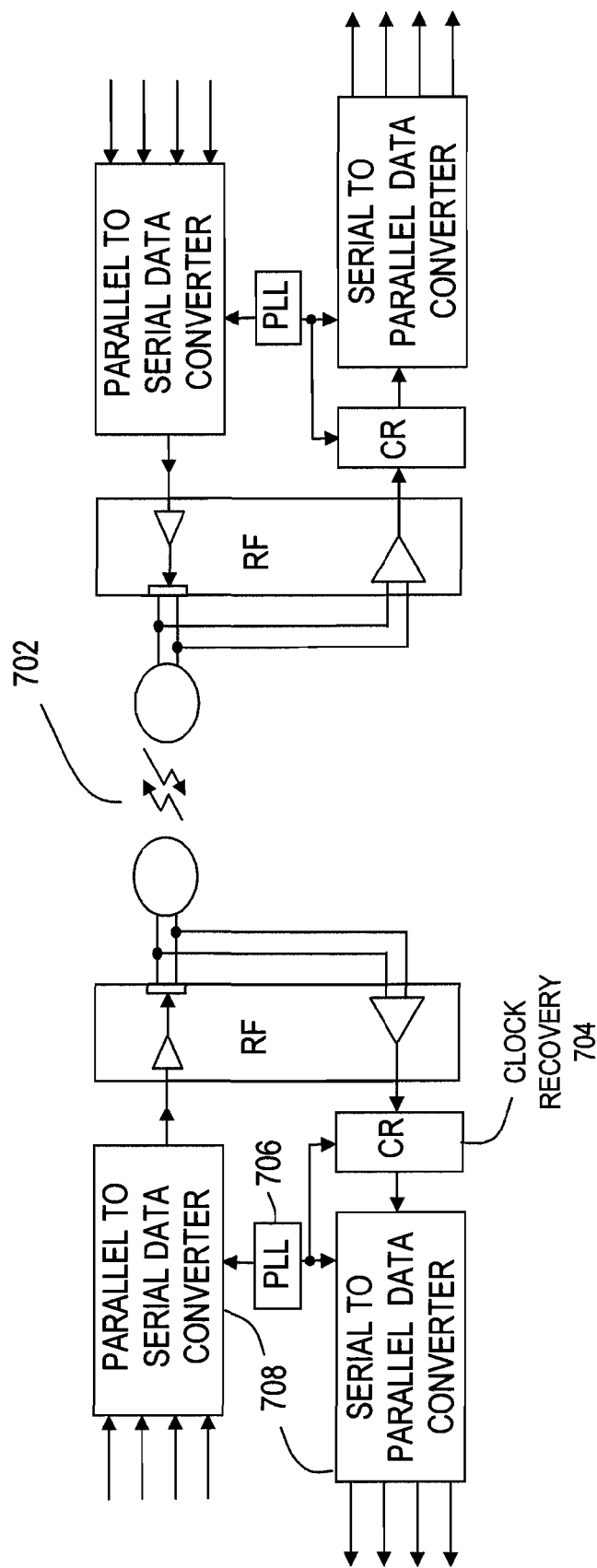
FIG. 7 shows an embedded clock serial Serializer/Deserializer (SerDes) that provides the wireless interface for the memory devices.

FIG. 7 show further details for the serial link illustrated in the previous figures. This serial link 702 provides communication between two electronic devices and may use an embedded clock serial architecture such as a Serializer/Deserializer (SerDes). The embedded clock bits architecture transmitter serializes the data bus and the clock onto one serial signal pair. Two clock bits, one low and one high, are embedded into the serial stream every cycle, framing the start and end of each serialized word and creating a periodic rising edge in the serial stream. Included in this architecture are a Clock Recovery (CR) circuit 704 that includes a Phase Locked Loop (PLL) 706, a coding scheme 708, and a matching network for the on-die or off-die loop antenna.

By now it should be apparent that embodiments of the present invention allow increased memory storage efficiencies by using features, either singularly or in combination, that allow data to be reliably transferred in a distributed memory system using near-field coupling. The wireless interface provides a method of uploading code and transferring data in inter-die communication while maintaining the maximum allowable data rate.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A memory module including a package, the package to house multiple memory devices, the memory module comprising:
    a memory controller formed in the package and having a loop antenna to transmit over-the-air data; and
    a first memory device and a second memory device each formed in the package and each having a near-field interface coupled to one or more loop antennas to receive the over-the-air data from the memory controller, the first memory device and the second memory device each being further configured to communicate with each other directly via radio-frequency wireless signals in the near-field through the respective one or more loop antennas.

2. The memory module of claim 1, wherein the first memory device includes a transceiver coupled to the loop antenna to provide bi-directional communication with the second memory device.

3. The memory module of claim 1, where a coil is formed on a substrate to which the first memory device is attached to create near-field magnetic coupling with the second memory device and the memory controller.

4. The memory module of claim 1, wherein a coil is molded into a plastic housing, the first memory device to create near-field magnetic coupling with the second memory device and the memory controller.

5. The memory module of claim 1, wherein data is to be transmitted wirelessly and a control signal, a reference clock, and a chip select signal are hardwired from the memory controller to the first and second memory devices.

6. The memory module of claim 1, wherein a memory/antenna combination is stacked on top of another memory/antenna combination in a same package.

7. The memory module of claim 1, wherein the first and second memory devices are mounted on a substrate and stacked, and are located next to an unstacked memory controller.

8. The memory module of claim 1, further including a switch device in the stack of the first and second memory devices to select a chip-select pin for each memory device to control bus arbitration.

9. The memory module of claim 8, wherein the switch device is to communicate with the memory controller using wired serial links.

10. A stacked memory device housed in a package, including:
   a first memory device having a near-field interface coupled to a first loop antenna and a first radio subsystem; and
   a second memory device having a near-field interface coupled to a second loop antenna and a second radio subsystem to transmit and receive wireless communications directly from the first memory device, the loop antenna of a corresponding one of the first memory device and the second memory device being configured to receive over-the-air data transmitted from a memory controller housed in the package.

11. The stacked memory device of claim 10, wherein the wireless communications between the first and second memory devices housed within the stacked memory device use an enhanced Gigabit Ethernet port.

12. The stacked memory device of claim 10, further including a memory controller located next to the first and second memory devices that are stacked.

13. The stacked memory device of claim 12, wherein the first and second memory devices and the memory controller are configured to transmit data wirelessly and other signals are hardwired from the memory controller to the first and second memory devices.

14. The stacked memory device of claim 12, further including a switch device in the stack of first and second memory devices to select a chip-select for each memory device in the stack.

15. A memory module including a package, the memory module comprising:
   a memory controller formed in the package and having a loop antenna to transmit over-the-air data;
   a plurality of memory devices in a first stack of memory devices, each of the plurality of memory devices having a near-field interface, a radio subsystem, and one or more loop antennas, each of the memory devices being configured to communicate with both the memory controller and directly with other ones of the plurality of memory devices through the one or more loop antennas via radio-frequency wireless communications; and
   a switch device in the first stack of memory devices each formed in the package, the switch to individually select one of the plurality of memory devices in the first stack to receive the over-the-air data from the memory controller.

16. The memory module of claim 15, further including a switch device in a second stack of memory devices to individually control selection of the memory devices in the second stack, where the first stack, the second stack, and the memory controller are located side-by-side.

17. The memory module of claim 15, wherein the memory devices in the first stack and the memory devices in the second stack each have a near-field interface and a loop antenna to communicate via the radio-frequency wireless communications with the memory controller.

18. The memory module of claim 15, wherein the memory devices in the first stack and the memory devices in the second stack are configured to communicate via the radio-frequency wireless communications with each other.

19. The memory module of claim 15, wherein the memory devices in the first stack each have a coil formed on a substrate to create near-field magnetic coupling with other memory devices in the first stack and with the memory controller.

20. The memory module of claim 1, wherein at least one of the first and second memory devices comprises a configuration routing table to keep track of routing information for other memory devices in the memory module.

21. The memory module of claim 20, wherein the configuration routing table is to be updated dynamically during operation of a corresponding one of the first and second memory devices.

* * * * *